United States Patent [19]

Lee

[11] Patent Number: 5,700,603

[45] Date of Patent: Dec. 23, 1997

[54] SEMICONDUCTOR DEVICE HAVING X-RAY LITHOGRAPHIC MASK AND METHOD FOR MANUFACTURING THE SAME

[75] Inventor: Byung-hun Lee, Uiwang, Rep. of Korea

[73] Assignee: Samsung Electronics Co., Ltd., Suwon, Rep. of Korea

[21] Appl. No.: 590,796

[22] Filed: Jan. 24, 1996

[30] Foreign Application Priority Data

Jan. 24, 1995 [KR] Rep. of Korea ............. 95-1229

[51] Int. Cl.$^6$ ............................................. G03F 9/00
[52] U.S. Cl. ............................. 430/5; 378/34; 378/35
[58] Field of Search .................. 430/5, 311, 312; 378/34, 35

[56] References Cited

U.S. PATENT DOCUMENTS

| 5,023,156 | 6/1991 | Takeuchi et al. ............... 430/5 |
| 5,082,695 | 1/1992 | Yamada et al. ................ 430/5 |

OTHER PUBLICATIONS

Membrane Fragility: Fact or Illusion?, by L.E. Trimble, G.K. Celler, J. Frackoviak, and G.R. Weber, J. Vac. Sci. Technol. B. 10(6), Nov. 1992.

*Primary Examiner*—S. Rosasco
*Attorney, Agent, or Firm*—Samsung Electronics Co., Ltd.

[57] ABSTRACT

In a mask for X-ray lithography and a method for manufacturing the same, a mask pattern is formed on a first silicon substrate and then an intermediate material is coated on the mask pattern in order to protect the mask pattern and further the intermediate material of the first silicon substrate is stuck on a second silicon substrate where a membrane is to be formed. Next, the second silicon substrate is thinned by methods of grinding and polishing. Here, thickness of the membrane can be controlled depending on an etching amount in unit of grinding and polishing. Therefore, since the membrane is formed after the mask pattern has been formed, not only transformation of the mask pattern generated from a process of mask pattern and breakage of the mask pattern can be prevented but also thickness of the mask pattern can be controlled as desired.

18 Claims, 6 Drawing Sheets

SEMICONDUCTOR DEVICE HAVING X-RAY LITHOGRAPHIC MASK AND METHOD FOR MANUFACTURING THE SAME

BACKGROUND OF THE INVENTION

The present invention relates to a semiconductor device having lithography. More particularly the present invention relates to a semiconductor device having a mask for X-ray lithography and a manufacturing method therefor.

Electric devices in microcircuits or high-integrated semiconductor devices are formed through a series of processes of doping impurities on predetermined regions of a silicon substrate and then connecting or shorting these regions. A pattern for determining the device regions of high-integrated semiconductor devices is formed by lithography. Two types of lithography exist: optical lithography and lithography using an electron beam, an ion beam, or X-rays. In optical lithography, a part of a substrate exposed to ultraviolet radiation or a part not exposed to ultraviolet radiation is developed by using a photosensitive film. In electron beam, ion beam, or X-ray lithography, an electron beam, an ion beam, or X-rays are used to develop part of the substrate. The characteristics of transferring an image to a silicon substrate by lithography-patterned masks are determined by the mask's resolution and pattern registration capability.

However, since the pattern resolution and the pattern registration capability of optical lithography are limited to about 1 micrometer and ±3 micrometers, respectively, the compactness of high-integration semiconductor devices is limited. Accordingly, lithography using electron beam, ion beam or X-ray is used to enhance pattern transfer ability. Unfortunately, each of these types of lithography has its own problems. Electron beam lithography is expensive and limits the resolution because of scattering of the electron beam on a resist and a substrate. Ion beam lithography has difficulty in obtaining the ions for the lithography. X-ray lithography has difficulty in resolving patterns, which are limited by irradiation conditions over a long period. However, X-ray lithography not only eliminates discordance between a focus of a lens and a center line of a photosensitive film, i.e., the reflection and scattering that can occur in the optical or electron beam lithography, but also can obtain high-resolution patterns and can form a great deal of patterns.

FIGS. 1A through 1D show cross-sectional views of a manufacturing process of a mask for X-ray lithography by a conventional method. One example of this conventional method is disclosed in G. K. Celler, et at. "Review of X-ray Lithography" (See, e.g., FIG. 5).

Figure 1A:
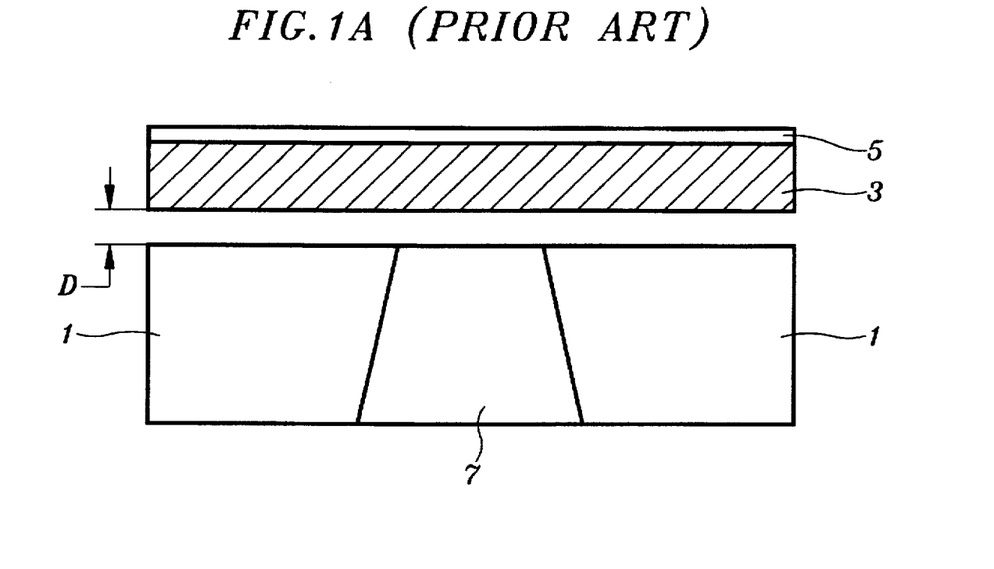
FIGS. 1A through 1D show cross-sectional views of manufacturing process of a semiconductor device having an X-ray lithographic mask by a conventional method.

FIG. 1A shows a view of attaching a glass ring 1 to a silicon substrate 3. In particular, a silicon epitaxial layer 5 doped with boron is initially formed on a silicon substrate 3. Then, a center portion of the glass ring 1 is eliminated by wet etching, thus forming an opening 7. The width of the opening 7 is wider at the lower portion of glass ring 1 than at a contact surface of the silicon substrate and the glass ring. An interval "d" is eliminated by sticking glass ring 1 on silicon substrate 3.

Figure 1B:
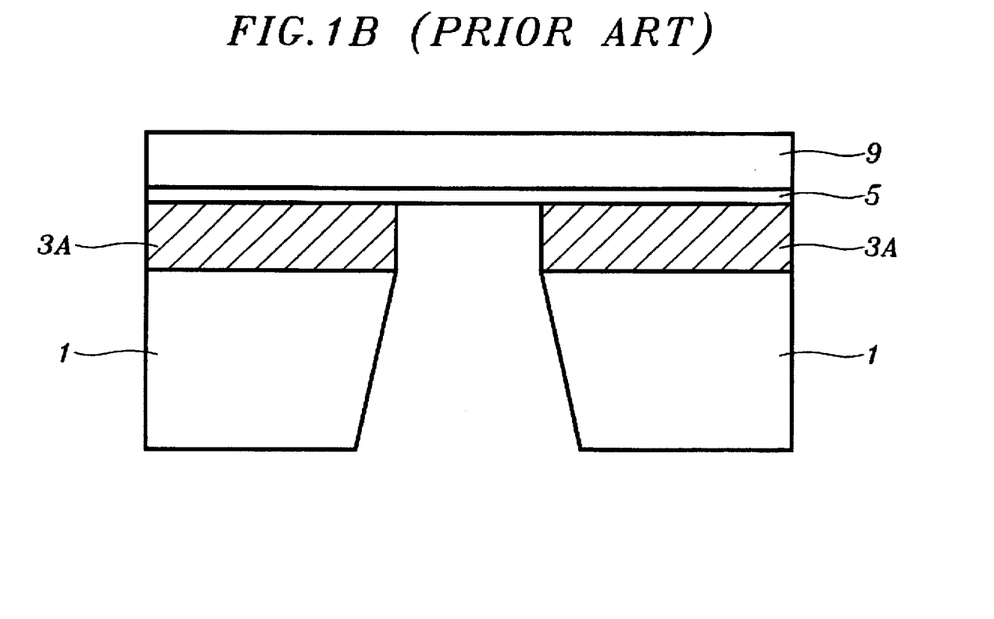

FIG. 1B shows a view of forming a lower supporting film of a mask pattern. Nitride is deposited on the surface of the silicon epitaxy layer 5 to form a nitfide layer 9, then a portion of the silicon substrate 3 exposed by the opening 7 of the glass ring 1 is etched. The boron-doped silicon epitaxial layer 5 and the nitfide layer 9 are not etched at this time. These unetched layers form a lower film for supporting an X-ray absorption layer carrying pattern information.

Figure 1C:
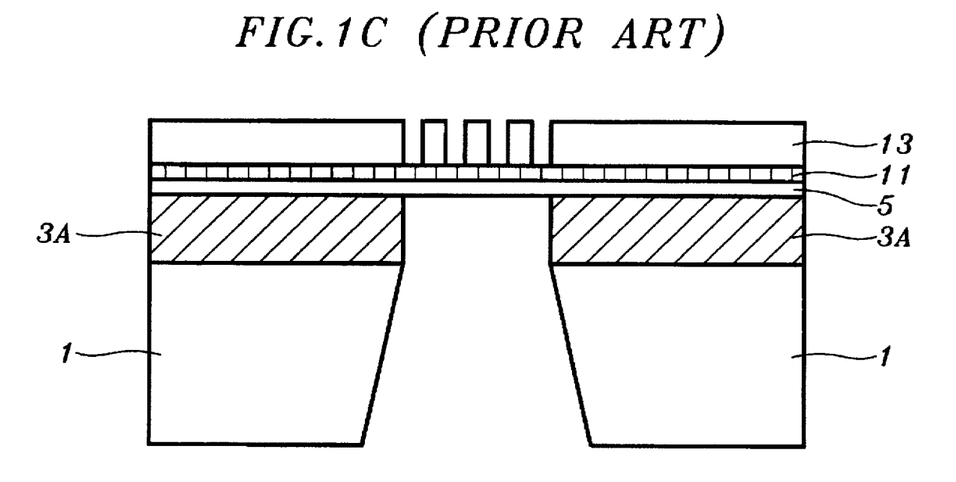

FIG. 1C shows a view of forming a resist pattern on the silicon epitaxial layer 5 on the upper surface of the etched silicon substrate 3a. 50 Å of chrome and a gold epitaxial layer of 100 Å are vaporized and further deposited on a silicon substrate, to form a compound layer 11 of chrome/gold. The upper surface of the chrome/gold compound layer 11 is then coated with resist. The resist is then photosensitized and developed by electron beam or X-ray, to form a photoresist mask pattern 13.

Figure 1D:
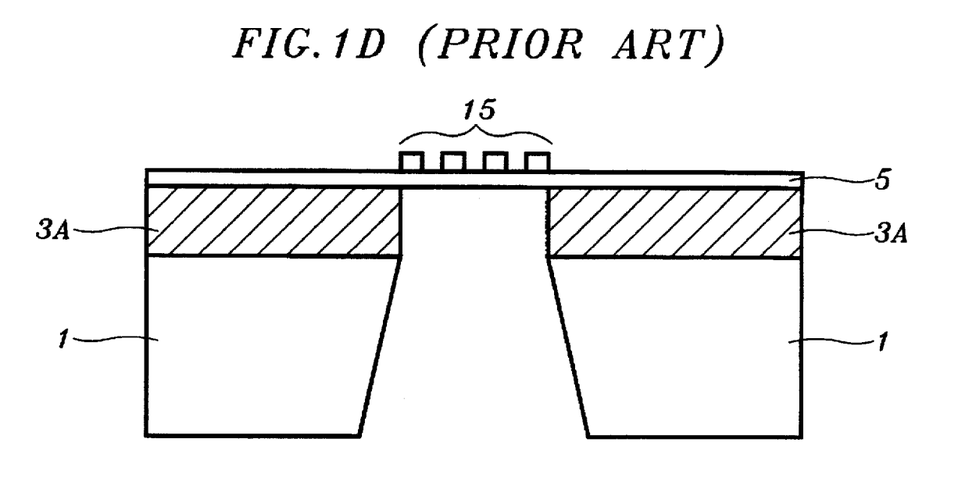

FIG. 1D shows a view of forming an X-ray absorption layer 15 by using the etchant compound layer 11 and the photoresist mask pattern 13 as an etching mask and then removing the photoresist mask pattern 13. Dry etching is used for forming the X-ray absorption layer. The X-ray absorption layer 15 carrying pattern information should have high-density and high-impedance. Accordingly uses gold, tungsten and tantalum as in the compound layer 11.

Another conventional method of manufacturing a mask by using X-ray disclosed in G. K. Celler, et al. "Formation of monolithic masks for 0.25 µm x-ray lithography," Appl. Phys. Lett., Vol. 59, p. 3105 (Dec. 9, 1991) This method is shown in FIGS. 2A through 2D and is described below.

Figure 2A:
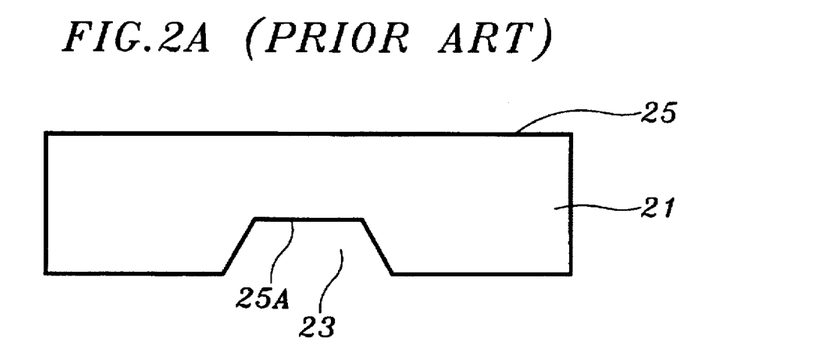
FIGS. 2A through 2D show cross-sectional views of a manufacturing process of a semiconductor device having an X-ray lithographic mask by another conventional method.

FIG. 2A shows a view of forming a silicon layer on a glass disk. A glass disk 21 is provided in the shape of a hexahedron with the center recessed by etching. The upper width of the recession 23, i.e., at the point closest to the upper surface of the glass disk is narrower than its lower width. Here, the upper surface 25a of the recession is at a predetermined interval distant from the upper surface of glass disk 21. Then, an amorphous layer is deposited on the whole surface of the disk and further the polysilicon is recrystallized, thereby forming a recrystallized layer 25.

Figure 2B:
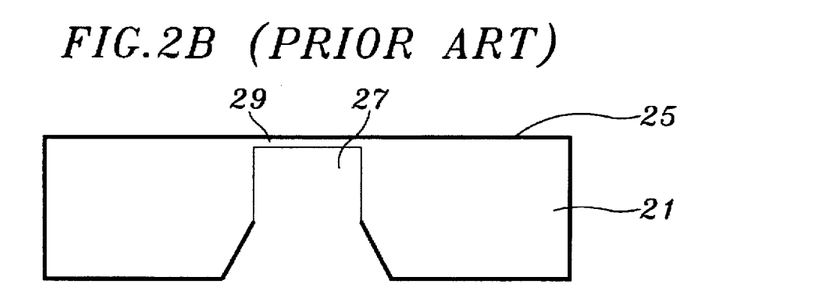

FIG. 2B shows a view of forming an X-ray mask membrane. In particular, the upper surface 25a of the recession of recrystallized layer 25 is etched so that a window 27 is formed by the eliminated recrystallized layer. That is, the glass disk directly exposed to outside is etched, in which the recrystallized layer 25 formed on the upper surface of the disk is not exposed, thereby forming a thin layer 29.

Figure 2C:
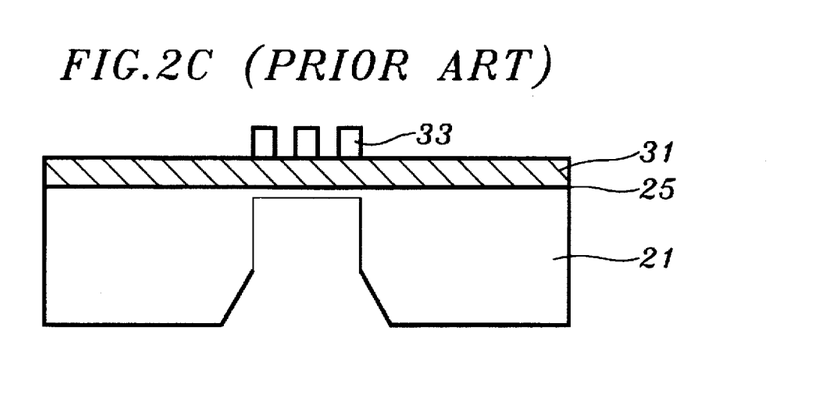

FIG. 2C shows a view of forming an X-ray absorption layer and a resist pattern. A compound layer 31 of chrome/tungsten/chrome is deposited on the upper surface of the glass disk. Further, an electron beam resist film is coated and then a predetermined part is etched, thereby forming a pattern 33.

Figure 2D:
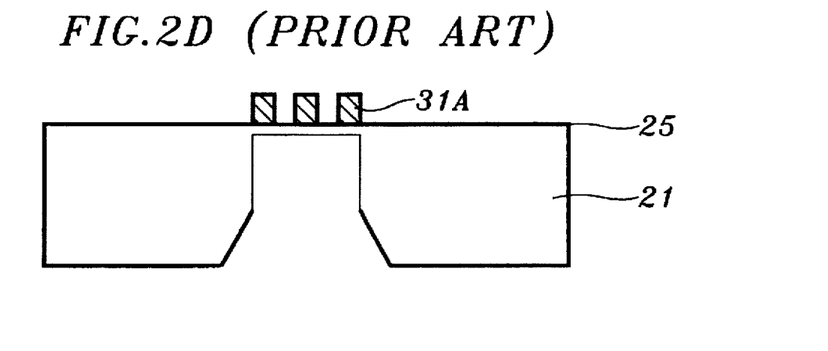

FIG. 2D shows a view of completing a mask. The compound layer 31 is dry-etched. However, only compound layer 31 located under the resist pattern 33 is not etched so that only resist patterns 33 and the compound layer under the resist patterns remain. That is, when the resist pattern 33 and the compound layer existing on the recrystallized layer 25, which are not subjected to etching, are eliminated, a desired mask pattern 31a is completed.

Compared to the former method, this method is economical and advantageous since the wet-etch of the silicon substrates and the epitaxial process are omitted and bonding process of the silicon to the glass is not needed.

However, in this method as in the former method, the mask pattern is formed after the X-ray mask membrane is formed. The X-ray mask membrane, which is formed by etching the silicon substrate or the glass disk, is of 1-2 micrometer thickness, which is very thin. Therefore, thickness of the X-ray mask membrane cannot be easily controlled as desired, and further following processes such as the resist pattern formation and etching of the X-ray absorption layer are limited.

Meanwhile, in methods of FIGS. 1A through 1D and 2A through 2D, a silicon epitaxial layer or a recrystallized silicon layer is used as the X-ray mask membrane. Here, a process of forming the silicon epitaxial layer requires much cost. Besides, since a silicon layer should be heated to the temperature required for recrystallizing the silicon layer and recrystallization is performed on the glass disk. Therefore, the stiffness of the membrane is lowered.

SUMMARY OF THE INVENTION

Accordingly, it is an object of the present invention to provide a semiconductor device having a mask for X-ray lithography capable of controlling the thickness of an X-ray mask membrane and a manufacturing method therefor.

To accomplish the above object of the present invention, there is provided a semiconductor device having a X-ray lithographic mask for forming a predetermined device pattern comprising: a membrane having a wider width than that of said device pattern; a mask pattern formed on the center region of said membrane; an intermediate layer formed on the peripheral region of said membrane and surrounding said mask pattern; and a supporter formed on said intermediate material, wall of said supporter meeting said intermediate material at predetermined angle.

The membrane is formed by a unit process including a grinding and polishing process, and the thickness of the membrane can be controlled depending on the etching amount in the unit process. Further, the mask pattern is formed of a compound of chrome and gold, and for the membrane, a silicon layer is used.

The acute angle is determined by an etchant used for forming the supporter and width of the intermediate material, and further becomes an angle of 45° when KOH is used as the etchant.

A method for manufacturing a semiconductor device of such a structure comprises the steps of: forming a mask pattern on part of a first silicon substrate having a predetermined thickness; depositing a first intermediate material on the whole surface of the substrate more thickly than thickness of the mask pattern; bonding to the first oxide film a second silicon substrate around which mask window protection layer is formed in all side surfaces thereof to the first oxide film; thinning the first silicon substrate; forming a mask window by eliminating a part of the mask window protection layer and part of the second silicon substrate; and sequentially eliminating the protecting layer of the mask window and the first oxide film formed on the mask pattern, so as to expose the mask pattern to the incident direction of the X-ray.

Here, the protecting layer of the mask window is formed of an oxide film and the steps of grinding and selective chemical/mechanical polishing constitute the thinning step. The thickness of the membrane can be controlled depending on the etching amount in the unit process. Further, the mask pattern can be formed of a compound of chrome and gold and the membrane is formed of a silicon layer.

The step of forming a second oxide film on all side surfaces of the thinned first silicon substrate can be provided, after thinning the step. The step of eliminating the second oxide film exposed to outside is further provided at the step of exposing mask pattern and the second oxide film is formed by thermal oxidation or CVD.

Furthermore, thermal treatment be performed in order to improve characteristic of adhesion, after the thinning step.

Therefore, the thickness of the X-ray mask membrane can be controlled as desired, and further the mask pattern can be formed before forming the membrane, the mask pattern is protected by the intermediate material and then exposed in a final process of manufacturing of the mask so that the characteristic of carrying information of the mask pattern is not damaged.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF A PREFERRED EMBODIMENT OF THE INVENTION

Figure 3:
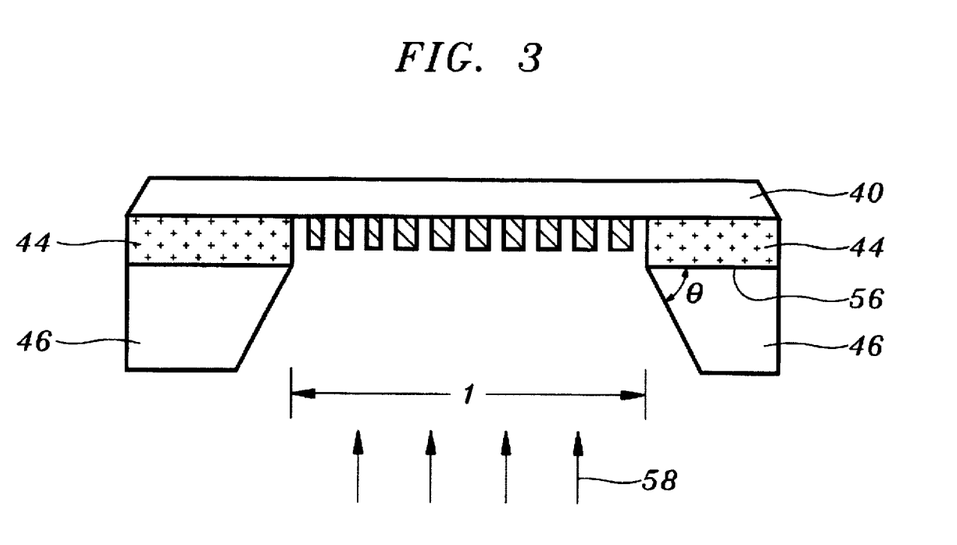
FIG. 3 shows a cross-sectional view of a semiconductor device having an X-ray lithographic mask according to a preferred embodiment of the present invention.

FIGS. 3 and 4A to 4H describe a preferred embodiment of the present invention. FIG. 3 shows a cross-sectional view of a semiconductor device of an X-ray lithographic mask according to the present invention.

A mask pattern 42, having a width 1, is formed on a portion of a membrane 40. The mask pattern 42 comprises solid portions and interstices between the solid portions. An intermediate layer 44 is formed on the membrane 40 surrounding the mask pattern 42. The intermediate layer 44 has an opening of length 1 so that it exactly surrounds the mask pattern 42. A mask supporter 46 is formed on the intermediate layer 44 at contact surfaces 56. The mask supporter 46 has an opening that varies in width across the thickness of the mask supporter 46. At the point where the mask supporter 46 meets the intermediate layer 44, the length of the opening is 1, the width of the mask pattern 42. At the opposite end of the mask supporter 46 from the intermediate layer 44, the length of the opening is greater than 1. The inner surface 50 of the opening in the mask supporter 46 is sloped and makes an acute angle with the contact surface 56. This angle is called the wet etching angle, $\theta$.

The membrane 40 and the mask supporter 46 preferably comprise silicon, although any other suitable material such as glass may be used. The mask pattern 42 preferably comprises chrome, gold, tungsten, or tantalum, but can be formed of any suitable material that absorbs X-rays.

X-rays 58 incident on the mask pattern 42 approach in a direction opposite to the direction that the mask pattern 42 protrudes from the silicon membrane 40. This means that the X-rays 58 are emitted onto the mask pattern 42 through the openings in the intermediate layer 44 and the mask supporter 46.

In this way the X-rays 58 are exposed to the mask pattern 42. The X-rays 58 cannot pass through the solid portions of the mask pattern 42, but can pass through the interstices between the solid portions of the mask pattern 42 where the membrane 40 is exposed. Thus, by exposing X-rays onto the mask pattern 42, a device pattern can be formed on a device (not shown) on the opposite side of the mask pattern 42 from the incident X-rays 58.

FIGS. 4A through 4H show cross-sectional views of a manufacturing process of a semiconductor device having an X-ray lithographic mask according to a preferred embodiment of the present invention. The same numbers will be used where possible in FIGS. 4A to 4H as are used in FIG. 3 to refer to similar portions.

Figure 4A:
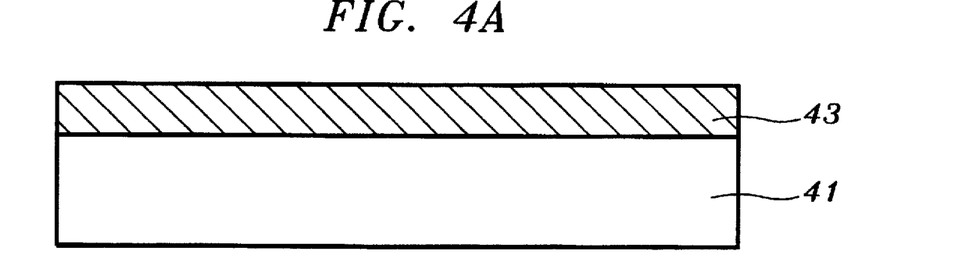
FIGS. 4A to 4H show cross-sectional views of a manufacturing process of a semiconductor device having an X-ray lithographic mask according to a preferred embodiment of the present invention.

FIG. 4A shows the step of coating a material for forming the mask pattern. In this step, an X-ray absorbing film 43 is formed over the surface of a first substrate 41. The X-ray absorbing film 43 preferably comprises chrome, gold, tungsten, or tantalum, although it may comprise any suitable material that absorbs X-rays.

Figure 4B:
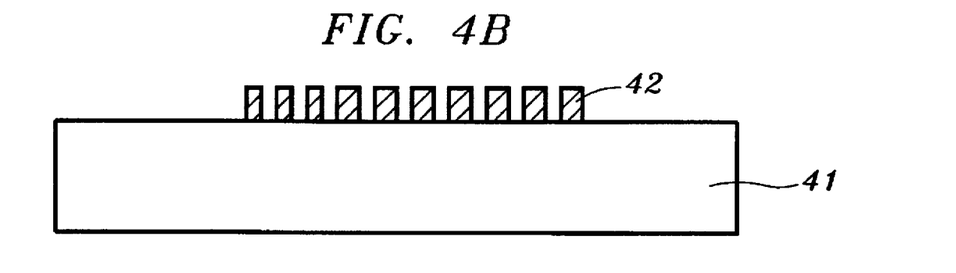

FIG. 4B shows the step of patterning a mask. In this step a predetermined portion of the X-ray absorbing film 43 is etched using a mask to form a mask pattern 42. When using X-ray lithography, the size of the mask pattern 42 is preferably the same as the size of the chip, because of the difficulty in collimating X-rays. The resulting mask pattern 42 preferably has a thickness of about 100 Å–200 Å.

Figure 4C:
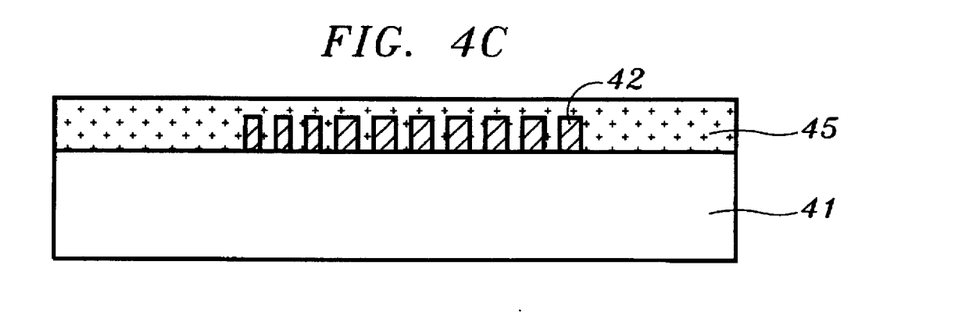

FIG. 4C shows the step of depositing an intermediate material 45 and planarizing the first substrate 41. In order to preserve the mask pattern 42 in the following processes of substrate adhesion and etching, an intermediate material 45 is deposited over the mask pattern, preferably by chemical vapor deposition (CVD). The intermediate material 45 should be thicker than the mask pattern 42 so that it completely covers the mask pattern 42. The first substrate 41, where the intermediate material 45 is deposited, is then planarized in order to improve the adhesion characteristic in a following adhesion process. However, since the mask pattern 42 preferably has a thickness of about 100 Å–200 Å, the planarization process may be omitted.

Figure 4D:
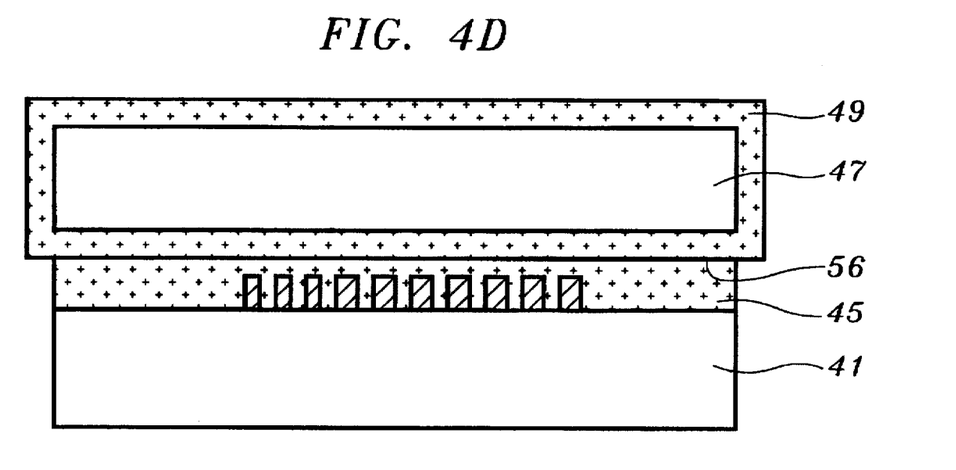

FIG. 4D shows the step of bonding the first substrate 41 to a second substrate 47. In this step, all side surfaces around the second substrate 47 are coated with an oxide film 49. The oxide film 49 preferably has a thickness of about 5,000 Å. The oxide film 49 is placed over first silicon substrate 41 so that the intermediate material 45 contacts a surface of the oxide film 49 formed around the second substrate 47, at a contact surface 56. The resultant structure is then preferably heated to about 1,100° C. to eliminate any voids in the contact surface 56. This can be done when the mask pattern 42 comprises chrome, which has a melting point of 1,803° C. and which is not influenced by the heat treatment. However, when the mask pattern 42 comprises gold, the heat treatment for the mask pattern should be performed at lower temperature than in the case of chrome, because the melting point of gold is 1,063° C. In addition, when the adhesion characteristics of the semiconductor device are good, such a heat treatment as described above is not necessary.

Figure 4E:
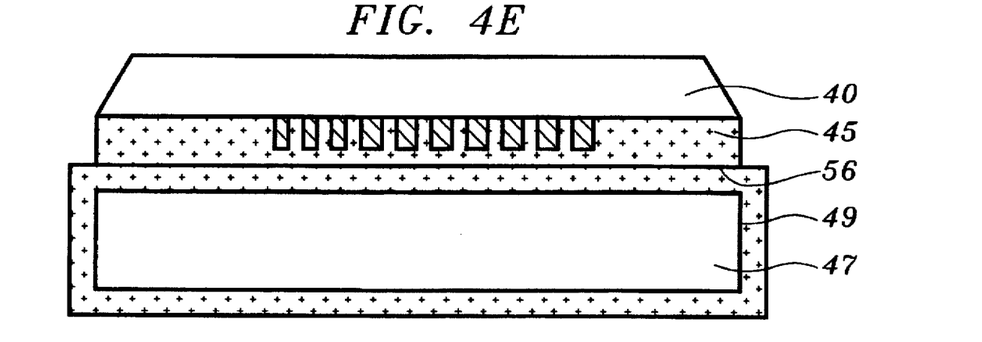

FIG. 4E shows the steps for forming an X-ray mask membrane. Initially, the first substrate 41 is processed by grinding and polishing. This thins the first substrate 41 to form the membrane 40. By performing selective chemical/mechanical polishing (CMP), the membrane 40 can be formed into a silicon on insulator (SOI) layer having a uniform thickness of up to 1,000 Å. Furthermore, by controlling the grinding and polishing steps, the amount of etching of the membrane 40 can be controlled from hundreds of angstroms to several millimeters.

Figure 4F:
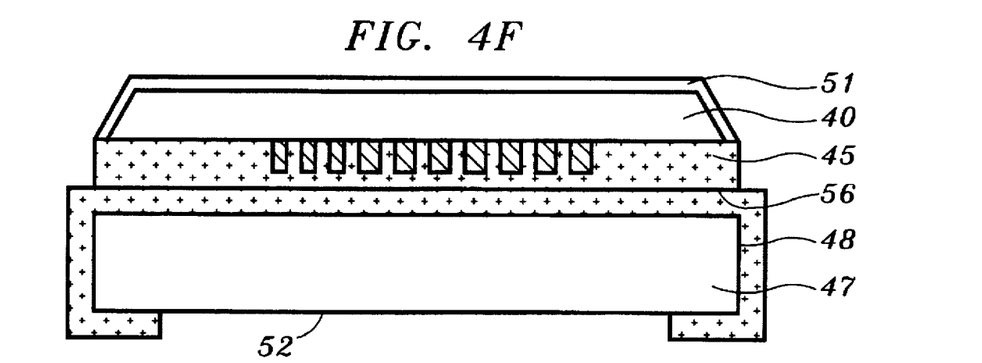

FIG. 4F shows the step of etching a mask window protection layer. In order to protect the membrane 40 in a following silicon etching process, a capping oxide film 51 is formed on all side surfaces of the membrane 40, preferably by thermal oxidation or CVD. Then, a predetermined portion of the oxide film 49 that is parallel with the adhesion surface 56 is etched by photolithography to form an opening 52 in the etched oxide film 48. The opening 52 corresponds to the portion of the second substrate 47 where a mask window 54 is to be formed, although the width of opening 52 is wider than that of the mask pattern 42.

Figure 4G:
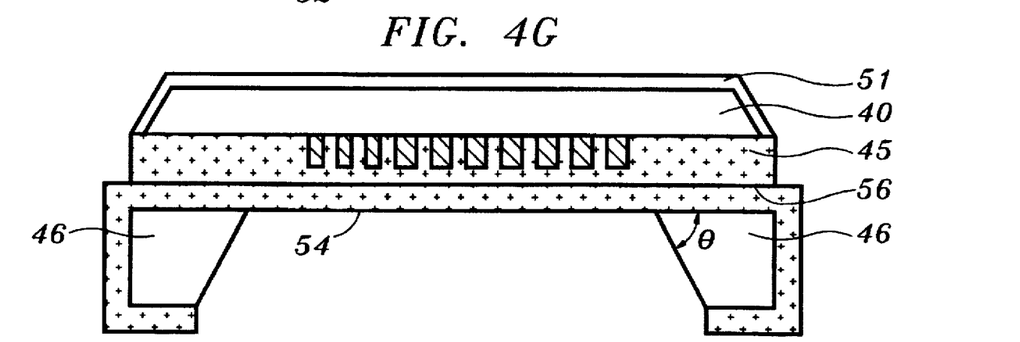

FIG. 4G shows the step of forming the mask window 54. The portion of the second substrate 47 exposed by the opening 52 is wet-etched to form the mask window 54, preferably using KOH as an etchant. Here, the portion of the etched oxide film 48 contacting intermediate material 45 on the membrane 40 is not etched. As the second substrate 47 is etched, the width of the mask window 54 becomes narrower. The remaining portion of the second substrate 47, serving as a mask supporter 46 is symmetrically arranged on the sides of the mask window 54. An oxide film is not formed on the sloping sides of the mask supporter 46 facing the mask window 54. Preferably, the angle between the sloping sides and the upper surface of the mask supporter 46 is about 45°. The angle of 45° results when KOH is used to etch a silicon second substrate 47 to form the mask supporter 46. If a different etchant or a different second substrate 47 material is used, the angle will be determined by the width of the mask window protect layer in FIG. 4 and the etchant.

Figure 4H:
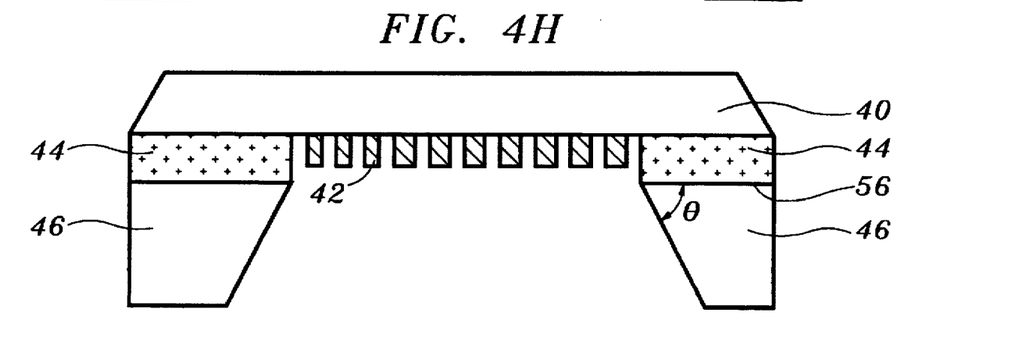

FIG. 4H shows the step of exposing the mask pattern. The portions of the etched oxide film 48 and the portions of the intermediate layer exposed to air are eliminated by etching. That is, a capping oxide film 51 formed on the first silicon substrate, an etched oxide film 48, an intermediate material 45 and a portion of the etched oxide film exposed to the air along the oxide film wrapping the mask supporters, are eliminated so that the mask pattern is exposed to the input direction of X-ray. The remaining portion of the intermediate material covered by the mask supporter 46 becomes the intermediate layer 44.

As described above, since the membrane 40 is formed after the mask pattern 42 has been formed, the drawbacks that the characteristic of the membrane could be influenced or broken by the following processes in the conventional method, are eliminated. Further, the membrane is formed by repeating grinding and polishing of a silicon substrate so that thickness of the membrane can be controlled as desired.

Furthermore, according to the present invention, since a silicon layer is preferably used for a membrane layer, thermal treatment for recrystallization is not necessary so that stiffness of an X-ray membrane and permeability of X-ray can be improved.

The present invention is not limited to the above-described embodiments. Various changes and modifications may be effected by one having an ordinary skill in the art within the scope of the invention as, defined by the appended claims.

What claim is:

1. A mask for lithography, comprising:

a membrane;

a mask pattern formed on a central region of the membrane;

an intermediate layer formed on the peripheral region of the membrane and surrounding the mask pattern; and a supporter formed on said intermediate material, a wall of the supporter meeting the intermediate material at a predetermined angle, wherein the mask pattern, the intermediate material, and the supporter are formed over one side of the membrane.

2. A mask according to claim 1, wherein the mask pattern comprises a compound of chrome and gold.

3. A mask according to claim 1, wherein said membrane comprises silicon.

4. A mask according to claim 1, wherein the lithography is X-ray lithography.

5. A manufacturing method for a mask according to claim 4, wherein said mask window protecting layer comprises an oxide film.

6. A manufacturing method for a mask according to claim 5, wherein thickness of said membrane is controlled depending on an etching amount in a unit process.

7. A method for manufacturing a mask for lithography, the method comprising the steps of:

forming a mask pattern on a central portion of a first substrate having a predetermined mask thickness;

depositing a first intermediate layer over the first substrate, having an intermediate thickness greater than the mask thickness;

bonding a first oxide film to a mask window protection layer surrounding a second substrate;

grinding and polishing the first substrate;

forming a mask window by eliminating a part of the mask window protection layer and a part of the second substrate; and sequentially eliminating the mask window protection layer exposed to an outer side and the first intermediate layer formed on said mask pattern, so as to expose said mask pattern to an incident direction of X-rays.

8. A manufacturing method for a mask according to claim 7, wherein said thinning step further comprises the steps of grinding the first substrate; and chemical/mechanical polishing.

9. A manufacturing method for a mask according to claim 7, wherein said mask pattern is formed of a compound of chrome and gold.

10. A manufacturing method for a mask according to claim 7, wherein said membrane is formed of a silicon layer.

11. A manufacturing method for a mask according to claim 7, wherein a second oxide film is formed on all side surfaces of the thinned first silicon substrate after said thinning step.

12. A manufacturing method for a mask according to claim 7, further comprising the step of eliminating said second oxide film exposed to outside, after said step of exposing the mask pattern.

13. A manufacturing method for a mask according to claim 12, wherein said second oxide film is formed by thermal oxidation or chemical vapor deposition.

14. A manufacturing method for a mask according to claim 7, further comprising the step of thermal treatment in order to improve characteristic of adhesion, after said thinning step.

15. A manufacturing method for a mask according to claim 7, wherein the first substrate comprises silicon.

16. A manufacturing method for a mask according to claim 7, wherein the first substrate comprises glass.

17. A manufacturing method for a mask according to claim 7, wherein the second substrate comprises silicon.

18. A manufacturing method for a mask according to claim 7, wherein the second substrate comprises glass.

* * * * *